United States Patent [19]

Feuerbaum et al.

[11] Patent Number: 4,460,866

[45] Date of Patent: Jul. 17, 1984

[54] METHOD FOR MEASURING RESISTANCES AND CAPACITANCES OF ELECTRONIC COMPONENTS

[75] Inventors: Hans-Peter Feuerbaum; Ulrich Knauer, both of Munich, Fed. Rep. of Germany

[73] Assignee: Siemens Aktiengesellschaft, Berlin & Munich, Fed. Rep. of Germany

[21] Appl. No.: 284,827

[22] Filed: Jul. 20, 1981

[30] Foreign Application Priority Data

Sep. 29, 1980 [DE] Fed. Rep. of Germany ....... 3036734

[51] Int. Cl.³ .............................................. G01R 27/00
[52] U.S. Cl. .............................. 324/57 PS; 324/60 C; 324/62; 324/71.3; 324/73 PC
[58] Field of Search .............. 324/57 PS, 57 R, 60 C, 324/62, 51, 71.3, 73 PC; 250/305, 311, 492.1, 311/397

[56] References Cited

U.S. PATENT DOCUMENTS

| | | | |
|---|---|---|---|
| 3,239,664 | 3/1966 | Farell | 324/71.3 X |
| 3,315,156 | 4/1967 | Keller | 324/62 X |
| 3,373,353 | 3/1968 | Harris | 324/71.3 X |
| 3,403,332 | 9/1968 | Watanabe et al. | 324/57 R |
| 3,464,007 | 8/1969 | Williams | 324/57 R |
| 3,531,716 | 9/1970 | Tarui et al. | 324/51 |

OTHER PUBLICATIONS

H. P. Feuerbaum Article entitled: "VLSI Testing Using the Electron Probe," Scanning Electron Microscopy, 1979, vol. 1, pp. 285-296 (1979).

*Primary Examiner*—Stanley T. Krawczewicz
*Attorney, Agent, or Firm*—Hill, Van Santen, Steadman & Simpson

[57] ABSTRACT

A method for measuring a resistance and a capacitance of an electronic component utilizes electron beam measuring technology to impress a current $I_A$ by means of a pulsed electron beam on the component. A potential curve $U(t)$ which arises during the pulse on the electronic component as a result of the impressed current is utilized together with the known current to determine the resistance R and the capacitance C by means of an appropriate selection of two measuring points $U(t_1)$ and $U(t_2)$ on the potential curve.

4 Claims, 6 Drawing Figures

METHOD FOR MEASURING RESISTANCES AND CAPACITANCES OF ELECTRONIC COMPONENTS

BACKGROUND OF THE INVENTION

The invention relates to a method for measuring resistances and capacitances of eletronic components.

Up to now, the measurement of resistances and capacitances of electronic components was carried out with a mechanical probe. The smallest measurable capacitance according to this method amounted to 1 pF. The loading effects associated with such probes affects accurate measurement.

SUMMARY OF THE INVENTION

An object of the invention is to measure resistances and capacitances of electronic components in a load-free manner.

This object is inventively achieved in that a current $I_A$ is impressed by a pulsed electron beam onto a component with the resistance R and the capacitance C, according to $I_A=I_R+I_C$, whereby the potential curve U(t) which is produced during the pulse at the electronic component as a result of the impressed current $I_A$ is measured. From this current and voltage, the resistance R and the capacitance C can be determined by means of an appropriate selection of two measuring points U ($t_1$), U($t_2$) given a known current $I_A$. Significantly smaller capacitances can be determined with this measuring method than is possible according to the prior art.

In order to measure the potential curve U(t), the method standard in electron beam measurement technology is advantageously applied with the assistance of a secondary elctron spectrometer with which the change of potential at the component is first measured and from which, then, the potential curve U(t) is determined. Electron beam measurement or testing is described in the Feuerbaum article discussed hereafter.

Expediently, the saturation voltage $U_S = U\ (t \rightarrow \infty) \approx U(5RC) = U(t_1)$ and $U_S \cdot 0.63 = U(t=RC) = U(t_2)$ are employed as the two measuring points U($t_1$), U($t_2$) required for the determination of the resistance R and of the capacitance C.

In an advantageous embodiment of the invention, when a measurement is carried out on a circuit, for example, on an integrated circuit, the frequency of the electron pulses is synchronized with the frequency of the signal at a component which is a part of the circuit, so that the resistance R and the capacitance C can be dynamically determined at this component. Conclusions may then be drawn concerning the load connected to this component.

DESCRIPTION OF THE PREFERRED EMBODIMENTS

Figure 1:
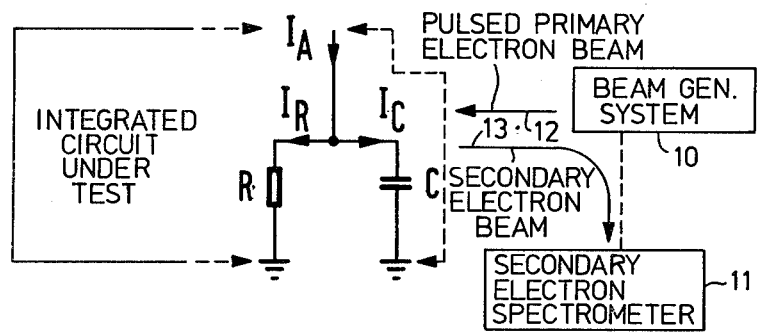
FIG. 1 shows an equivalent R and C circuit diagram of a component to be measured.

In the measuring method according to the invention, a current $I_A$ is impressed by means of the electron beam on a component with the resistance R and the capacitance C according to $I_A=I_R+I_C$. The equivalent circuit diagram for this measuring method for resistances and capacitances of electronic components is shown in FIG. 1.

The following differential equation applies for the resultant charges of the component:

$$I_A - \frac{U}{R} - \frac{dU}{dt} \cdot C = 0$$

with the solution $$U = I_A \cdot R \left(1 - e^{-\frac{1}{RC}t}\right).$$

Figure 2:
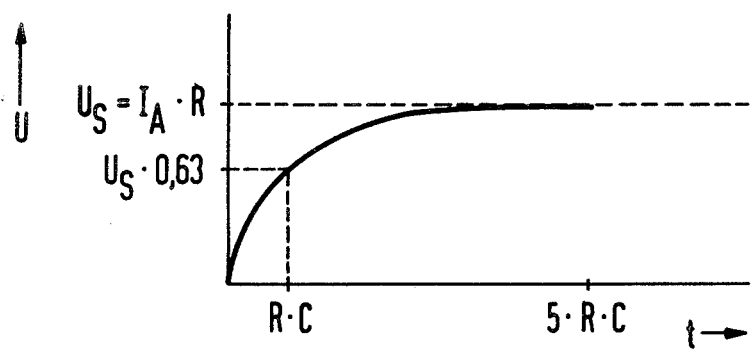
FIG. 2 shows the determination of the resistance R and the capacitance C from the potential curve U(t).

Accordingly, the charge of the component for $t \rightarrow \infty$ ($\approx 5 \cdot RC$) attains a saturation voltage $U_S$ from which, given the known current $I_A$, the resistance R can be calculated. The capacitance C is calculated from the equation $U(t=RC)=U_S \cdot 0.63$, whereby the resistance value R learned from the saturation voltage $U_S$ is to be inserted for the resistance R. When the potential curve U(t) has been experimentally measured, then the resistance R and the capacitance C, for example, can be advantageously graphically determined from the potential curve U(t) as shown in FIG. 2.

Given a potential resolution of 1 mV, a chronological resolution of 5 ns, and an electron current $I_A$ of $10^{-7}$A, the useful range of the method is calculated as $R \geq 10\ K\Omega$
$C \geq 500$ fF (at 10 K$\Omega$)
$C \geq 5$ fF (at 1M$\Omega$).

A system can be employed for the measuring method of the invention as are described, for example, by H. P. Feuerbaum in "VLSI Testing Using The Electron Probe", SEM/1979/Vol. 1, 285-296, (1979), incorporated herein by reference. For measurement of the charge, the electron current is impressed in pulse-shaped manner on the electronic component. The potential change within the pulse is interrogated. For this purpose, the method which is standard in electron beam measurement technology is advantageously employed with the assistance of a beam generating system 10 and a secondary electron spectrometer 11 as described in the above article. In other words, a primary electron beam 12 is directed at the component and a second electron beam 13 results which is related to potentials occuring on the component.

When, given a measurement according to the invention of an integrated circuit, for example, the frequency of the electron pulses is synchronized with the frequency of the signal at the measuring point, then the resistance R and the capacitance C can also be dynamically determined. From the measurement of the resistance R and of the capacitance C, conclusions can then be drawn concerning the load connected to the corresponding component.

Following hereafter is a description of the pulse electron beam generating system and secondary electron spectrometer employed for the measuring method of the invention and which is taken from the aforementioned Feuebaum article.

SPECTROMETER SETUP

For measuring the voltage of integrated circuits with secondary electrons, retarding field spectrometers have proved their value by providing a definite signal voltage characteristic which simplifies subsequent linearization. The characteristic is the integral SE energy distribution.

$$i_{SE} = \int_{eV_{eff}}^{50\ eV} i_{PE}\ \sigma(E)\ dE$$

$V_{eff}$ is the potential barrier between the measurement point at the voltage $V_P$ and the grid of the retarding field with the voltage $V_G$.

$$V_{eff} = V_P - V_G$$

The potential barrier is adjusted such that the low energy secondary electrons which are influenced by local fields despite the strong extraction field are unable to overcome it and so impair the accuracy of the measurement $$V_{eff} > V_B.$$

The dimensions of a spectrometer used to measure voltage on VLSI-MOS circuits should be as small as possible, because mesurements on metal lines with their present width of only 4µm require a beam diameter of 1.2 µm which, using a PE energy of 2.5 KeV, a beam current of $10^{-7}$A and a tungsten cathode, can only be performed at a working distance of 5 mm.

Since the electrostatic fields of the spectrometer should also not be allowed to defocus or deflect the primary electron beam, those components of the fields that are normal to the PE beam must be kept as small as possible.

LINEARIZATION

As a calibration curve, the signal-to-voltage characteristic can be used for quantitative measurements but this is time-consuming. A more practical solution is to provide linearization through a feedback loop which responds to any voltage variation on a 1:1 ratio. The bandwidth of the feedback loop should be as large as possible for further signal processing and the measurement of non-periodic signals as encountered in microprocessors. The SE signal which overcomes the potential barrier $V_{eff}$ of the retarding-field spectrometer is for this purpose amplified in a scintillator/photomultiplier combination by a factor v and compared with a nominal value $i_s$. The slightest deviations from the nominal value are strongly amplified for controlling the voltage $V_G$ at the grid of the retarding field so that after amplification the signal of the secondary electrons overcoming the potential barrier $V_{eff}$ always corresponds to the nominal value.

$$i_S = vi_{SE} = v \int_{eV_{eff}}^{50\ EV} i_{PE}\ \sigma(E)\ dE = \text{const}$$

with $$V_{eff} = V_P - V_G = f(\delta, v)$$

$\delta, v = \text{const}$ $\Delta V_P = \Delta V_G$

Assuming a constant yield $\delta$ (E) and constant amplification v of the SE signal the feedback loop will supply a feedback signal $V_G$ whose variation $\Delta V_G$ corresponds to a voltage variation $\Delta V_P$ at the measurement point. The potential barrier $V_{eff}$ is determined by the amplification factor v; if a scintillator/photomultiplier combination is used, it is adjusted via the photomultiplier voltage. The nominal value being constant, the potential barrier increases with increasing photomultiplier voltage.

SAMPLING MODE

Since the bandwidth of a feedback loop is in principle not sufficient to allow the observation of waveforms in the MHz or GHz range, these have to be measured by the sampling technique. The setup for the quantitative measurement of voltages is for this reason used in combination with a beam blanking system. The PE beam is synchronously pulsed with the waveform at the measurement point and the primary electrons which strike the measurement point during a certain phase emit secondary electrons with negligible delay. The voltage at the measurement point is then determined in the described manner from the shift in the energy distribution of these secondary electrons. The total period of a waveform is sampled through the temporal shifting of the PE pulses relative to the waveform at the measurement point.

VOLTAGE RESOLUTION

The voltage resolution $\Delta V_{min}$ realized in the sampling mode is determined by the slope of the signal voltage characteristic supplied by the spectrometer by the beam current and by the noise current in the measuring system. Since the slope of the signal voltage characteristic depends largely on the SE energy distribution—the resolution of the spectrometer is responsible for only negligible smear—the resolution can only be increased by improving the signal-to-noise ratio.

The noise current is composed of the shot noise of the primary and secondary electrons and of noise deriving from instabilities in the measuring system and from the contamination of the measurement point. If the instabilities and the contamination are neglected, the voltage resolution can be calculated from the shot noise, $$\Delta V_{min} = d\sqrt{\frac{c \cdot \Delta f}{i_{PE}}}$$

where d is an instrument constant, c the duty cycle and $\Delta$ f the frequency interval within which the voltage variation is measured. The frequency interval can be reduced by the integration time of the SE signal processing system or by special filters in order to increase the voltage resolution.

EXPERIMENTAL SETUP

Figure 3:
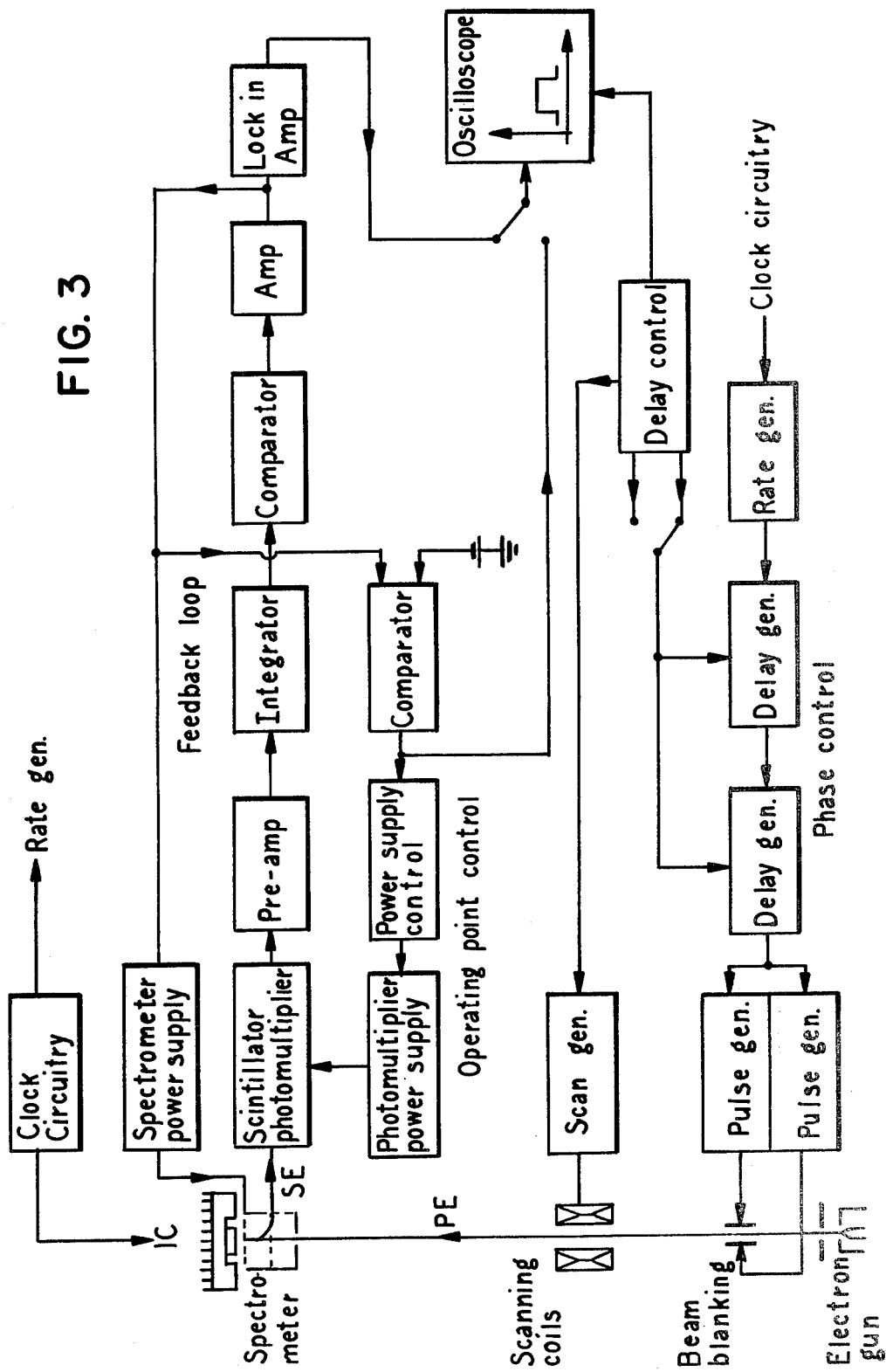
FIG. 3 is a schematic block diagram illustration of the known prior art beam generation and secondary electron spectrometer system for measuring waveforms using the sampling mode.

As already noted, the sampling mode is the principal measuring mode for the function testing of integrated circuits. As the sampling mode is made progressively easier to handle, other measuring modes such as voltage-coding lose correspondingly in importance. The time-consuming resetting of parameters such as photomultiplier voltage, beam current, etc., is avoided by reducing the measuring technique to an easy routine, which greatly increases its availability. In developing the experimental setup, efforts were therefore made to improve its performance and to simplify the handling of the sampling mode. FIG. 3 shows the experimental setup, which consists of the following items:
 feedback loop
 operating point
 control and
 phase control.

The beam is generated by the electron microscope column of an ETEC AUTOSCAN SEM. The column mounts on the mini-chamber specially designed for measurements on VLSI circuits and operates in combination with a beam blanking system.

FEEDBACK LOOP

Figure 4:
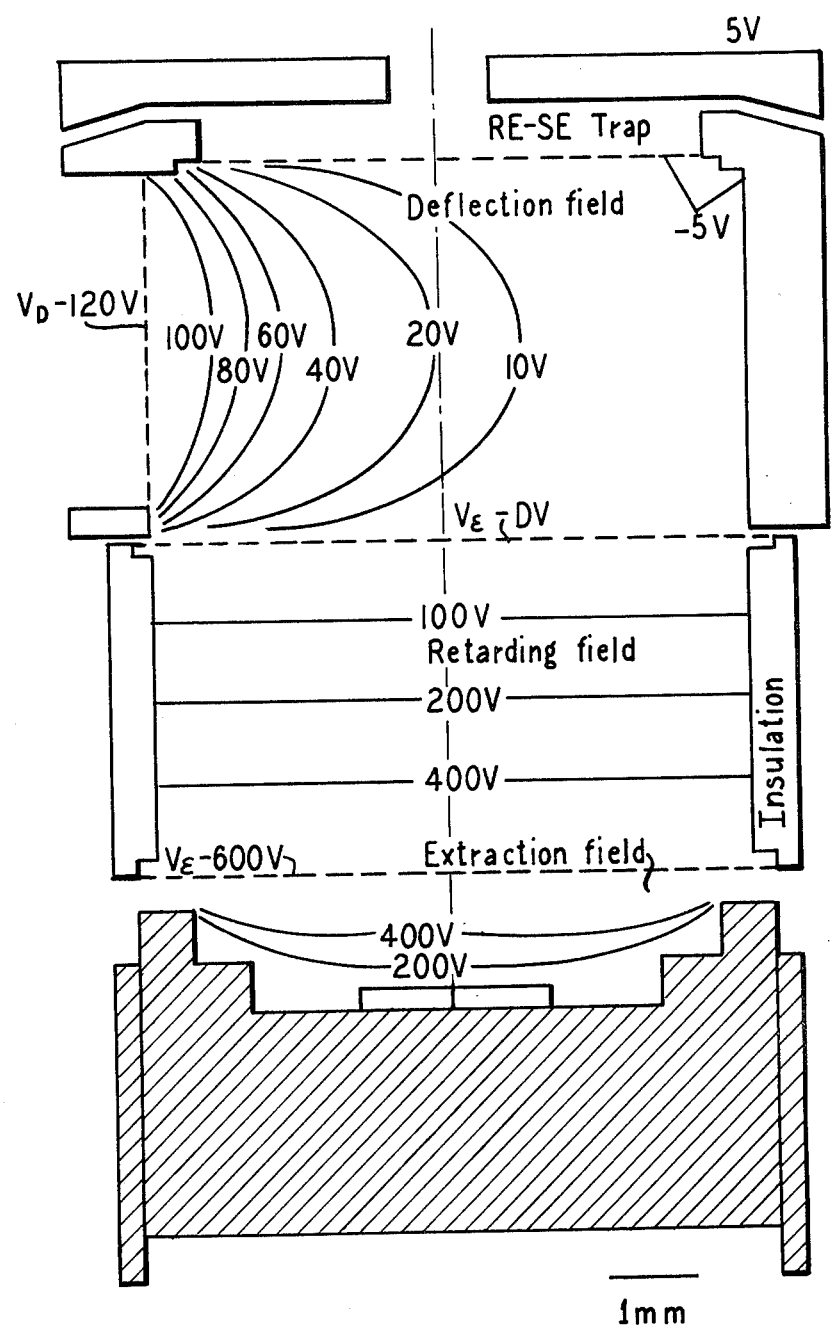
FIG. 4 is an illustration of the three potential lines within a retarding field spectrometer of the prior art.

One of the principal features of the feedback loop is the spectrometer setup, which had to be specially developed on account of the required reduction of the PE beam diameter. FIG. 4 shows the spectrometer setup, which fits into the conical cavity (5.5 mm) in the pole plate. Given a spectrometer height of 10 mm, this reduces the working distance to only 5 mm. Equipotential lines within the retarding field spectrometer are shown in FIG. 4.

To avoid beam delfection or defocusing in the spectrometer the secondary electrons accelerated by the extraction electrodes are not deflected directly to the SE collector as in the earlier setup but only after deceleration by the retarding field. The current of the secondary electrons $i_{SE}$ emitted from a metal line in the spectrometer already reaches saturation with a delfection voltage of $V_D = 60\ V$.

Figure 5:
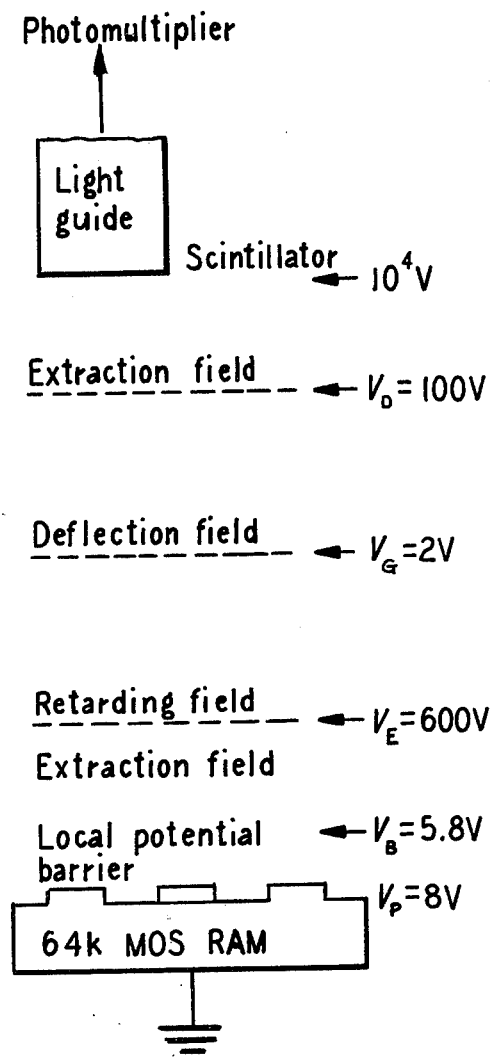
FIG. 5 illustrates the principle of measuring voltage with the aid of secondary electrons according to a known prior art method.
Figure 5:
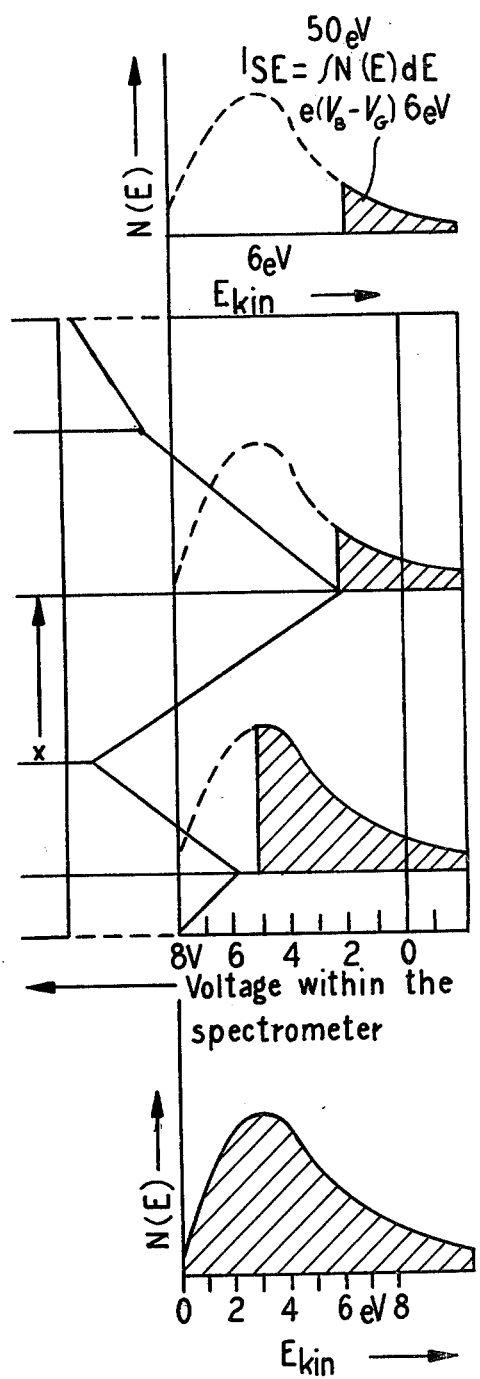

FIG. 5 shows the principle of measuring voltage with the aid of secondary electrons. The functioning of the spectrometer setup is shown in FIG. 5 with reference to the example of a 64 k MOS-RAM. The voltage variation on a 4μm wide line at 8V is shown. Seen on the left is the potential distribution between a metal line (8V) and the SE collector ($10^4$V). The way in which those voltages influence the SE energy distribution is shown on the right. As already described, the secondary electrons have to overcome a potential barrier of 2.2 V, whereby their energy distribution is truncated at 2.2 eV. In the retarding field of the spectrometer the secondary electrons have to overcome a retarding voltage of $V_P - V_G = 6V$, so that only one quarter of secondary electrons emitted contribute to the signal.

Since the secondary electrons with energies below 6 eV do not contribute to the signal, the influence of the potential barrier is suppressed. The signal is amplified in a scintillator/photomultiplier combination, integrated in the preamplifier and finally compared in the comparator with the nominal value. The deviation from the nominal value controls amplification, the voltage of the overall spectrometer setup.

As shown in FIG. 3 a lock-in amplifier is used to allow sensitive measurement of an ac component in the amplifier output signal.

OPERATING POINT CONTROL

For the suppression of local fields the potential barrier $V_{eff}$ has to be set to about 6 V. If a scintillator/photomultiplier combination is used, this is accomplished on account of $$V_{eff} = f(\delta,\ V)$$

via the gain of the photomultiplier. In the setup used hitherto the entire IC under test was grounded ($V_P = 0V$) and the voltage at the grid of the retarding field set to about 6 V for adjusting the potential barrier. This adjustment has to be repeated very frequently when switching between visual inspection for the localization of measurement point and operation in the sampling mode.

The purpose of operating point control is to automate the hitherto manual control of the photomultiplier gain. The IC under test is for this purpose grounded with the aid of the clock circuitry. A comparator compares the potential barrier which builds up with a nominal value (6V) and controls the photomultiplier voltage such that the potential barrier is adjusted to this value. With the photomultiplier voltage now constant, the supply voltage is applied to the IC. The output signal of the comparator equals the voltage $V_P$ at the measurement point and controls the y-axis of a recording oscillograph.

PHASE CONTROL

Figure 6:
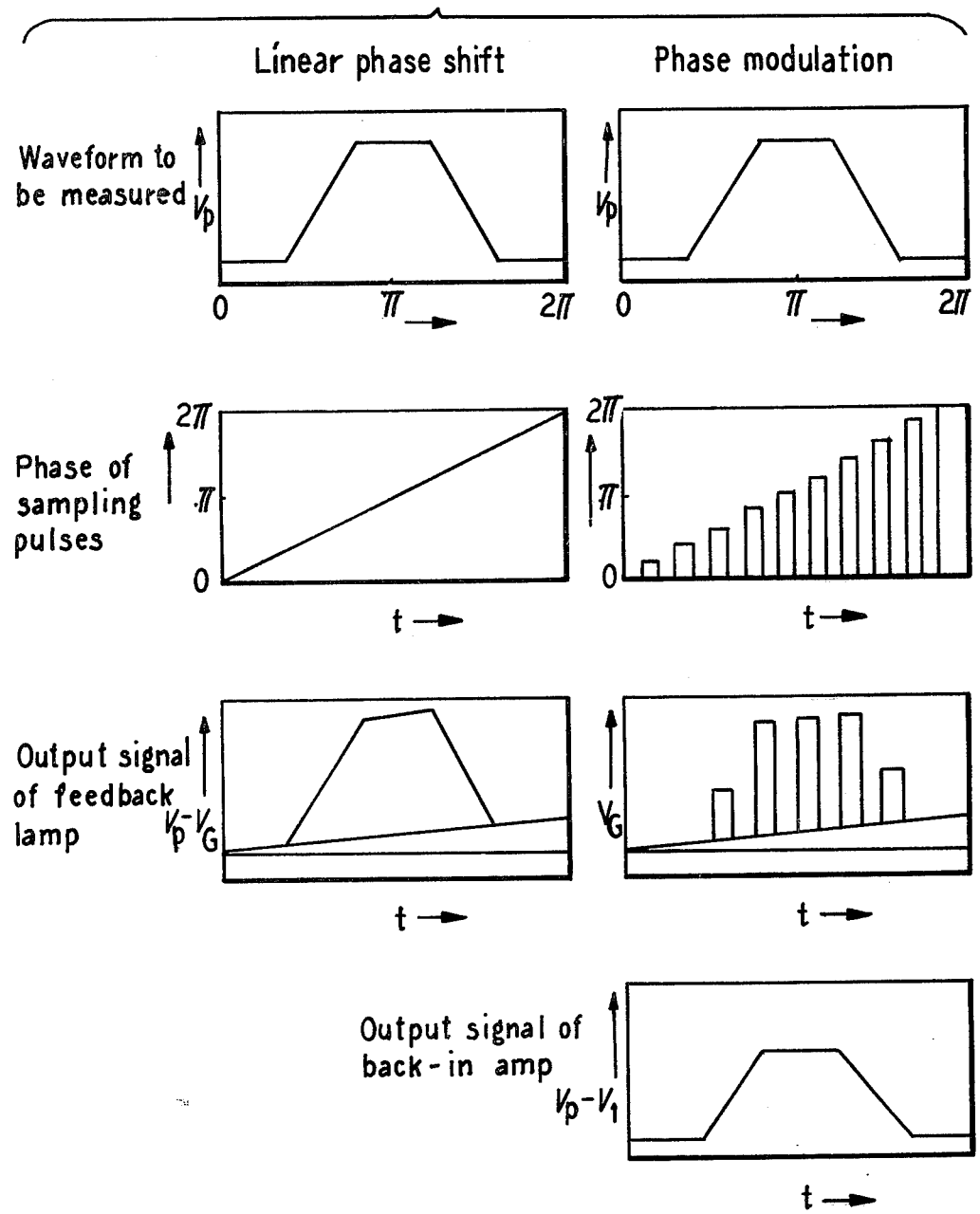
FIG. 6 shows measurement of waveforms using the sampling mode.

FIG. 6 shows measurement of waveform using the sampling mode:
 (a) conventional linear phase shift; and
 (b) phase modulation.

For waveform measurements, usually the main clock of the IC clock circuitry drives a beam blanking system via a rate generator (HP 1906 A), delay and pulse generators (HP 1908 and HP 1920 A). The setup allows a 300 ps width PE pulse which is in synchronism with the waveform at the measurement point. The delay generators are accessed by a generator (MEM7002) for controlling the delay interval. Two different methods of phase control have been developed for this purpose. In one, the delay generators are driven by a sawtooth signal such that the entire period of a waveform is continuously scanned from 0° to 360° (FIG. 10 a). The required measuring interval is determined according to $$t = 0.8 \cdot \frac{d^2 \cdot c^2}{\Delta V_{min}^2 \cdot i_{PE}}$$

by the desired phase (time) and voltage resolution and by the beam current. The instrument constant is $d = 8 \cdot 10^{-9} V \cdot \sqrt{As}$. For a voltage resolution of 1 mV, with a duty cycle of $10^3$ and a beam current of $10^{31}\ 7$A, the required measuring interval is therefore 500 s. During this relatively long interval a contamination film forms at the measurement point which attenuates the SE signal. The signal attenuation is compensated in the feedback loop through the voltage $V_G$ at the grid of the retarding field going positive.

FIG. 6 shows schematically the effect of the contamination. Since the voltage resolution for long integration intervals is additionally limited by instrument instabilities, it can only be improved by eliminating the effects of both contamination and instrument instabilities. To this end a method, named phase modulation, was developed.

In phase modulation the phase of the PE pulses is not varied continuously as described before, but incrementally (FIG. 6). Thus the PE pulses reach the measurement point alternately during a phase increment and a reference phase. The SE signal processing system measures the voltage in both phases and supplies the difference as the measuring result. This means in detail that due to the alternation the output signal of the feedback loop contains an ac component whose amplitude equals the voltage variation between the phases. The ac component is detected by a lock-in amplifier and reproduces, integrated over various phase increments, the waveform uninfluenced by the described effects.

Although various minor modifications may be suggested by those versed in the art, it should be understood that we wish to embody within the scope of the patent warrented hereon, all such embodiments as reasonably and properly come within the scope of our contribution to the art.

We claim as our invention:

1. A method for measuring a resistance and a capacitance of an electronic component, comprising: impressing a current $I_A$ by means of a single pulsed electron beam on the component with the resistance R and the capacitance C wherein $I_A = I_R + I_C$; measuring a potential curve U(t) which arises during the pulse on the electronic component as a result of the impressed current $I_A$; and determining the resistance R and the capacitance C given the known current $I_A$ by means of an appropriate selection of two measuring points U ($t_1$) and U ($t_2$).

2. A method according to claim 1 wherein for the purpose of determining the potential curve U (t), a primary electron beam is directed at the component which causes a secondary electron emission as a result of potentials on the component, and with the assistance of a secondary electron spectrometer, the potential change at the component is first measured and from which the potential curve U (t) is then determined.

3. A method for measuring resistances and capacitances of electronic components according to claim 1 wherein saturation voltages $U_S = U(t \rightarrow \infty) \approx U(t \cdot RC) = U(t_1)$ and $U_S \cdot 0.63 = U(t = RC) = U(t_2)$ are employed as the two measuring points U($t_1$), U($t_2$) required for determination of the resistance R and of the capacitance C.

4. A method according to claim 1 wherein the component is a part of a circuit and during measurement on the circuit, a frequency of the electron pulses is synchronized with a frequency of the signal present at the component under measurement, so that the resistance R and the capacitance C are dynamically determined at the component whereby conclusions can then be drawn concerning a load connected to said component in the circuit.

* * * * *